US 8,018,733 B2

(12) United States Patent
Jia

(10) Patent No.: US 8,018,733 B2
(45) Date of Patent: Sep. 13, 2011

(54) CIRCUIT BOARD INTERCONNECTION SYSTEM, CONNECTOR ASSEMBLY, CIRCUIT BOARD AND METHOD FOR MANUFACTURING A CIRCUIT BOARD

(75) Inventor: Gongxian Jia, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 12/965,530

(22) Filed: Dec. 10, 2010

(65) Prior Publication Data

US 2011/0080719 A1    Apr. 7, 2011

Related U.S. Application Data

(63) Continuation of application No. 12/607,638, filed on Oct. 28, 2009, which is a continuation of application No. PCT/CN2008/070741, filed on Apr. 17, 2008.

(30) Foreign Application Priority Data

Apr. 30, 2007   (CN) ............................ 2007 1 0107167

(51) Int. Cl.
*H05H 1/14* (2006.01)
(52) U.S. Cl. ......... 361/788; 361/791; 361/803; 174/251
(58) Field of Classification Search .................. 174/251; 361/788, 791, 803
See application file for complete search history.

(56) References Cited

U.S. PATENT DOCUMENTS

| | | | | |
|---|---|---|---|---|
| 4,580,862 A | * | 4/1986 | Johnson | ......................... 439/248 |
| 4,686,607 A | * | 8/1987 | Johnson | ......................... 361/788 |
| 4,703,394 A | * | 10/1987 | Petit et al. | ...................... 361/790 |
| 6,392,142 B1 | | 5/2002 | Uzuka et al. | |
| 6,608,762 B2 | | 8/2003 | Patriche | |

(Continued)

FOREIGN PATENT DOCUMENTS

CN    1210399 A    3/1999

(Continued)

OTHER PUBLICATIONS

1$^{st}$ Office Action in corresponding Chinese Application No. 200710107167.8 (Jan. 23, 2009).

(Continued)

*Primary Examiner* — Tuan T Dinh
*Assistant Examiner* — Steven Sawyer
(74) *Attorney, Agent, or Firm* — Leydig, Voit & Mayer, Ltd.

(57) ABSTRACT

A circuit board interconnection system is disclosed according to the embodiments of the present invention. The system includes a first circuit board, a second circuit board, a third circuit board, a first connector and a second connector. The first connector and the second connector are mounted at two sides of the first circuit board respectively so that the second circuit board mounted on the first connector is perpendicular to the third circuit board on the second connector. The first connector and the second connector mounted respectively at two sides of the first circuit board are coupled to each other via an impedance controlled mechanism on the first circuit board. Another circuit board interconnection system, a circuit board, a connector assembly and a method for manufacturing a circuit board are disclosed according to the present invention. The circuit board adopts the impedance controlled mechanism which has a shielding function and an impedance controlled function to replace a via hole on the existing circuit board where the via hole has an uncontrollable resistance.

8 Claims, 8 Drawing Sheets

U.S. PATENT DOCUMENTS

| | | | |
|---|---|---|---|
| 6,757,177 B2 * | 6/2004 | Harris et al. | 361/788 |
| 7,564,694 B2 | 7/2009 | Cai et al. | |
| 2002/0046878 A1 | 4/2002 | Uzuka et al. | |
| 2002/0181217 A1 | 12/2002 | Patriche | |
| 2003/0123560 A1 | 7/2003 | Jacobsen et al. | |
| 2004/0094328 A1 * | 5/2004 | Fjelstad et al. | 174/251 |
| 2004/0196122 A1 | 10/2004 | Fisher et al. | |
| 2004/0212971 A1 | 10/2004 | Iguchi | |
| 2005/0103522 A1 | 5/2005 | Grundy et al. | |
| 2006/0022774 A1 | 2/2006 | Greeley | |
| 2006/0034320 A1 * | 2/2006 | Ripy et al. | 370/464 |
| 2006/0073709 A1 | 4/2006 | Reid | |
| 2006/0095581 A1 | 5/2006 | Ali et al. | |
| 2006/0137907 A1 | 6/2006 | Chheda et al. | |
| 2006/0146922 A1 | 7/2006 | Modlin | |
| 2007/0279878 A1 * | 12/2007 | Cai et al. | 361/760 |
| 2008/0031313 A1 | 2/2008 | Oksman | |

FOREIGN PATENT DOCUMENTS

| | | |
|---|---|---|
| CN | 1371239 A | 9/2002 |
| CN | 2671289 Y | 1/2005 |
| WO | WO 2006/102327 A1 | 9/2006 |
| WO | WO 2006/131793 A2 | 12/2006 |
| WO | WO 2007/118388 A1 | 10/2007 |
| WO | WO 2008/113280 A1 | 9/2008 |

OTHER PUBLICATIONS $2^{nd}$ Office Action in corresponding Chinese Application No. 200710107167.8 (Jul. 17, 2009).

$3^{rd}$ Office Action in corresponding Chinese Application No. 200710107167.8 (Dec. 4, 2009).

Written Opinion of the International Searching Authority in corresponding PCT Application No. PCT/CN2008/070741 (Jul. 31, 2008).

European Patent Office, Extended European Search Report in European Patent Application No. 08715146.0 (Apr. 16, 2010).

International Telecommunications Union (ITU), "Very High Speed Digital Subscriber Line Transceivers 2 (VDSL2)," Series G: Transmission Systems and Media, Digital Systems and Networks, Digital Sections and Digital Line System—Access Networks, G.993.2, XP17404696, pp. 1-250 (Feb. 17, 2006).

State Intellectual Property Office of the People's Republic of China, International Search Report in International Patent Application No. PCT/CN2008/070741 (Jul. 31, 2008).

State Intellectual Property Office of the People'S Republic of China, Written Opinion of the International Searching Authority in International Patent Application No. PCT/CN2008/070410 (Jun. 12, 2008).

Verbaeten et al., "Equalization and Echo Cencellation in DMT-Based Systems," Katholieke Universiteit Leuven, pp. 1-309 (Apr. 2004).

* cited by examiner

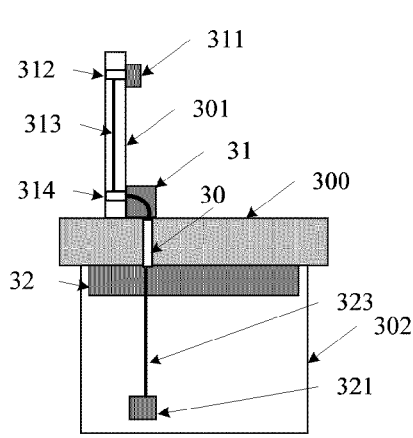 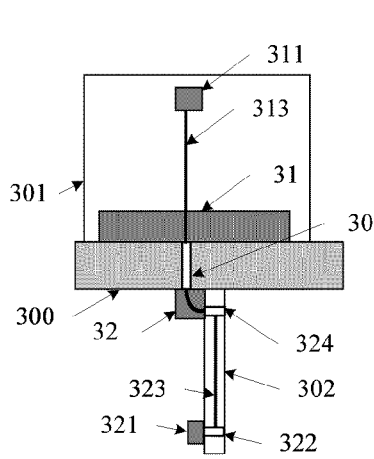
FIG.4a  FIG.4b  FIG.4c
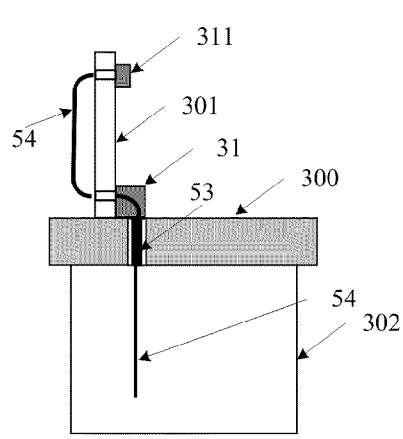 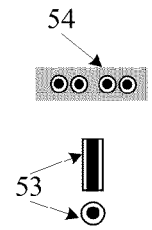 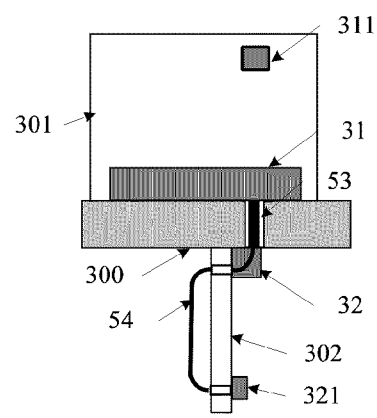
FIG.5a  FIG.5b  FIG.5c

SURFACE WELDING   SURFACE PRESSURE MOUNTING

CIRCUIT BOARD INTERCONNECTION SYSTEM, CONNECTOR ASSEMBLY, CIRCUIT BOARD AND METHOD FOR MANUFACTURING A CIRCUIT BOARD

CROSS-REFERENCE TO RELATED APPLICATIONS

This application is a continuation of U.S. patent application Ser. No. 12/607,638, filed on Oct. 28, 2009, which is a continuation of International Application No. PCT/CN2008/070741, filed on Apr. 17, 2008, which claims priority to Chinese Patent Application No. 200710107167.8, filed on Apr. 30, 2007, all of which are hereby incorporated by reference in their entireties.

FIELD OF THE INVENTION

The present invention relates to circuit board interconnecting technique, and more specifically, to circuit board interconnection system, connector assembly, circuit board and method for manufacturing a circuit board.

BACKGROUND

Backplane interconnection system is a common circuit board interconnection system. The backplane refers to a component which provides signal coupling, power supply, guidance, and physical support, etc., for one or more functional circuit boards implementing different functions in a communication system such as a switch, a router, a storage device, a computer or a server. Usually, the backplane includes a multilayer circuit board, signal/power backplane connector, guiding mechanism, etc.

A backplane interconnection system is formed by mounting one or more functional circuit boards implementing various functions on the backplane connectors of the backplane.

FIG. 1 is a mounting structure of an existing backplane interconnection system. As illustrated in FIG. 1, each functional circuit board 12 is parallel to each other and perpendicular to a backplane 10. Each functional circuit board is inserted into a slot on a backplane connector 11 so that the functional circuit board is connected with the backplane 10. The backplane connectors 11 as illustrated in FIG. 1 are on the same side of the backplane 10. In practice, a plurality of backplane connectors 11 may also be located on the two sides of the backplane 10, i.e., the functional circuit boards 12 can be mounted on two sides of the backplane 10.

With the increase of the signal transmission rate, high-speed data buses on the functional circuit boards and the backplane are generally arranged in a point-to-point differential interconnection topology. However, such topology may produce some undesirable effects on the transmission performance of each interconnection path in the backplane interconnection system. For instance, the high-speed data bus for coupling each functional circuit board on the backplane may cause signal attenuation on each interconnection path. Moreover, the length of these high-speed data bus may vary with the space among each backplane connector, causing different extent of signal attenuation on each interconnection path. In addition, FIG. 2 illustrates a schematic of an existing via hole connection section on the backplane in a backplane interconnection system. Multiple via holes 20 connected to the backplane connectors are provided on the backplane. Usually, there exists an unwanted portion 21 with a certain length for the via hole 20. The unwanted portion 21 of the via hole 20 may cause signal reflection.

In addition, the transmission performance of the high-speed backplane interconnection paths may be affected by other factors including material, conductor loss, wiring length, impedance control, delay between two transmission cables of a differential pair, and crosstalk between the differential pair, etc.

For the above reasons, the insertion loss and the return loss on each interconnection path in the backplane interconnection system are different, which increases the difficulty in IC design for the related functional chips on each functional circuit board. Consequently, this hinders the improvement of the transmission rate and the smooth update of the backplane.

In order to overcome the foregoing defects, an orthogonal mounting structure of a backplane interconnection system was proposed. In such structure, multiple functional circuit boards are mounted at two sides of the backplane. Moreover, the functional circuit boards at one side of the backplane are in a plane which is orthogonal to the plane that the functional circuits at the other side are in. FIG. 3 is a mounting structure schematic of an existing orthogonal backplane interconnection system. As illustrated in FIG. 3, a front card 301 and a back card 302 are respectively inserted into the slots on the two backplane connectors which are at two sides of the backplane 300, respectively. The front card 301 at one side of the backplane 300 is in a plane which is orthogonal to the plane that the rear card 302 at the other side is in. The backplane connectors at two sides of the backplane are coupled through via holes on the backplane 300. Thus, a driver or a receiver (chip) on the front card 301 is interconnected with a receiver or a driver (chip) on the rear card 302.

In such mounting structure, the length of signal cables on the circuit board which are used to connect slave circuit boards is shortened. In some case, signal cables can even be eliminated on the backplane. If the pad array in the mounting area for the backplane connector is in diagonal symmetry, that is, the pad array is symmetric along the diagonal of the mounting area for the backplane connector, signal cables can be eliminated. That is, when the pins are on the front card and rear card which are orthogonal to each other, corresponding pins of pins may share a same via hole.

Referring to FIG. 4a~4c, FIG. 4a is a front view of an existing orthogonal backplane interconnection system. FIG. 4b is a cross-section view of the front card 301 shown in FIG. 4a. FIG. 4c is a right view of an existing orthogonal backplane interconnection system. As illustrated in FIG. 4a~4c, the signal sent by the driver 311 on the front card 301 is transmitted along a via hole 312 on the front card, differential signal line 313, a via hole 314 to the backplane connector 31 coupled to the front card 301. Then, the signal is further transmitted to a receiver 321 on the rear card 302 along the backplane connector 21, a via hole 30 on the backplane 300, a backplane connector 32 coupled to the rear card 302, a via hole 324 on the rear card, differential signal line 323 and a via hole 322. Each pair of driver and receiver in the orthogonal backplane interconnection system may realize signal transmission in accordance with the approaches shown in FIG. 4a~4c.

With regard to the above structure, the existing backplane interconnection system still suffers from the below problems. The inability to control the via impedance may cause severe impedance inconsistency. Moreover, high signal density may result in a considerable crosstalk among via holes, thereby the crosstalk among each interconnection path appears.

Therefore, existing circuit board interconnection system like backplane interconnection system may suffer from a poor transmission performance. Moreover, the transmission rate is slow and the attempt to improve the transmission rate may also be hindered.

SUMMARY

In view of this, a circuit board interconnection system, a circuit board, a connector assembly, an impedance controlled mechanism, a communication device and a method for manufacturing a circuit board are provided according to embodiments of the present invention. Consequently, the transmission performance of the circuit board interconnection system or the circuit board can be improved.

A circuit board interconnection system is provided according to one embodiment of the present invention. The system may include a first circuit board, a second circuit board, a third circuit board, a first connector and a second connector. The first connector and the second connector are mounted at two sides of the first circuit board, respectively. The second circuit board is mounted on the first connector. The third circuit board is mounted on the second connector. The first connector and the second connector mounted at two sides of the first circuit board are connected via an impedance controlled mechanism on the first circuit board.

Another circuit board interconnection system is provided according to one embodiment of the present invention. The system may include a first circuit board, a connector mounted on the first circuit board, and a second circuit board coupled to the first circuit board via the connector. The first circuit board is provided with an impedance controlled mechanism, wherein the impedance controlled mechanism is electrically coupled to the connector and the second circuit board is electrically coupled to the first circuit board via the connector and the impedance controlled mechanism.

A circuit board is provided according to one embodiment of the present invention. An impedance controlled mechanism is provided at the position where the connector is mounted on the circuit board.

A connector assembly is provided according to one embodiment of the present invention. The connector assembly may include a first connector and a second connector. The connector assembly includes an impedance controlled mechanism. The impedance controlled mechanism includes:
 a hollow penetrating pin provided on the first connector, wherein the hollow penetrating pin is in hollow structure made of metal material and the inner wall of the hollow penetrating pin is covered with a dielectric layer;
 a penetrating pin provided on the second connector, wherein the penetrating pin is a metallic conductor for inserting into the hollow penetrating pin.

An impedance controlled mechanism is provided according to one embodiment of the present invention. The impedance controlled mechanism is applied to a circuit board and related structure. The impedance controlled mechanism includes a metallic conductor, a dielectric layer covering the outer surface of the metallic conductor, and a metal shielding layer covering the outer surface of the dielectric layer.

A communication device is provided according to one embodiment of the present invention. The communication device includes a circuit board interconnection system. The system includes a first circuit board, a second circuit board, a third circuit board, a first connector and a second connector. The first connector and the second connector are mounted at two sides of the first circuit board, respectively. The second circuit board is mounted on the first connector. The third circuit board is mounted on the second connector. The first connector and the second connector mounted respectively at two sides of the first circuit board are coupled via an impedance controlled mechanism on the first circuit board.

A method for manufacturing a circuit board is provided according to an embodiment of the present invention. The method includes:
 mounting an impedance controlled mechanism on the circuit board, wherein the impedance controlled mechanism is configured to connect connectors mounted at two sides of the circuit board.

Therefore, the present invention enjoys the below benefits.

The circuit board adopts the impedance controlled mechanism which has a shielding function and an impedance controlled function to realize the function of a via hole, i.e., replace an impedance-uncontrolled via hole on the existing circuit board. Since the impedance value of the impedance controlled mechanism is set based on the actual circuit environment and the impedance is stable and not subject to interference, the impedance inconsistency due to the metallized via hole and the crosstalk among each interconnection path can be overcome when the signal is transmitted via the impedance controlled mechanism. Thus, the transmission performance of the circuit board interconnection system and the circuit board is improved.

BRIEF DESCRIPTION OF THE DRAWINGS

FIG. 4a is a front view of an existing orthogonal backplane interconnection system;

FIG. 4b is a cross-section view of the front card in FIG. 4a;

FIG. 4c is a right view of an existing orthogonal backplane interconnection system;

FIG. 5a is front view of a master-slave circuit board interconnection system according to one embodiment of the present invention;

FIG. 5b is a cross-section view of a cable and an impedance controlled mechanism in FIG. 5a;

FIG. 5c is a right view of FIG. 5a;

DETAILED DESCRIPTION

Figure 1:
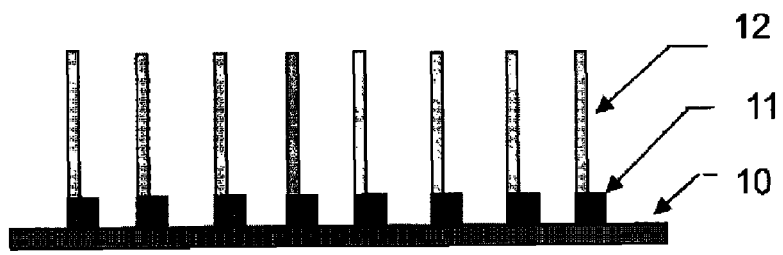
FIG. 1 is a mounting schematic of an existing backplane interconnection system.
Figure 2:
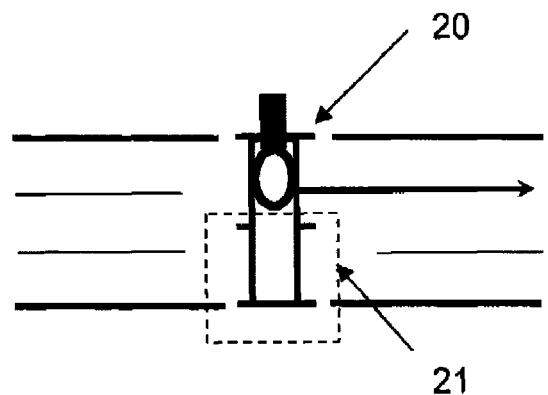
FIG. 2 is a mounting schematic of an via connection section on an existing backplane interconnection system.
Figure 3:
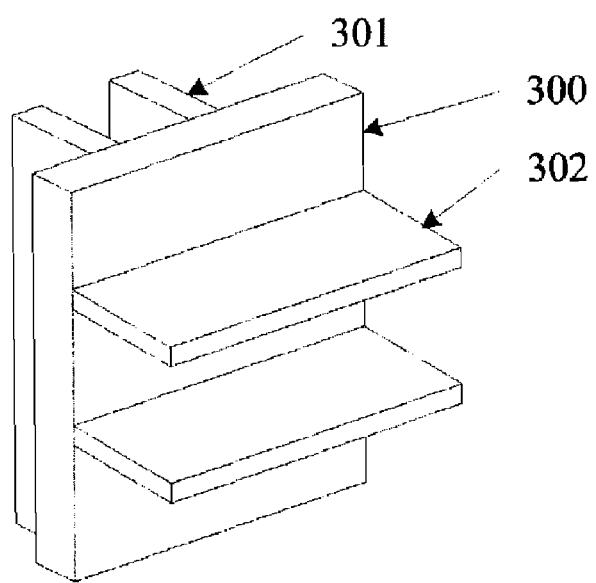
FIG. 3 is a mounting schematic of an existing orthogonal backplane interconnection system.

The purposes, technical solutions and advantages concerning the embodiments of the present invention will become more readily appreciated by reference to the following description of the embodiments.

In the embodiments of the present invention, a structure which has a shielding function and an impedance controlled function is used to realize via holes, i.e., to replace via holes on the existing circuit board. Meanwhile, in the embodiments of the present invention, high-speed cables also can be used to realize the high-speed differential signal lines on each slave circuit board for coupling to the circuit board connectors.

The high-speed cables may be twisted pair cables, coaxial cables, parallel cables, etc.

The circuit board interconnection system according to one embodiment of the present invention may include a first circuit board, a second circuit board, a third circuit board, a first connector and a second connector.

The first connector and the second connector are mounted on two sides of the first circuit board respectively in such a way that the second circuit board on the first connector mounted at one side of the first circuit board is perpendicular to the third circuit board on the second connector mounted at the other side of the first circuit board.

The first connector and the second connector mounted at two sides of the first circuit board are coupled to each other via an impedance controlled mechanism on the first circuit board.

Embodiments are illustrated by way of a backplane interconnection system as the circuit board interconnection system, a backplane as the first circuit board, a front card/rear card ("/" hereinafter refers to "or") as the second circuit board, a rear card/front card as the third circuit board, backplane connectors as the first connector and the second connector.

Referring to FIG. 5a~5c, FIG. 5a is a front view of a circuit board interconnection system according to one embodiment of the present invention. FIG. 5b is cross-section view of cable 54 and impedance controlled mechanism 32 shown in FIG. 5a. FIG. 5c is a right view of a circuit board interconnection system according to one embodiment of the present invention. As illustrated in FIG. 5a~5c, the circuit board interconnection system according to one embodiment of the present invention may include a front card 301, a rear card 302, a backplane connector 31, a backplane connector 32 and a backplane 300.

The backplane connector 31 and the backplane connector 32 are mounted at the two sides of the backplane 300, respectively, and these two connectors are coupled by the impedance controlled mechanism 53 on the backplane 300.

If an orthogonal mounting structure is utilized in the backplane interconnection system, the front card 301 and the rear card 302 may be mounted respectively on the backplane connector 31 and the backplane connector 32 which are at two sides of the backplane 300. The front card 301 and the rear card 302 are orthogonal to each other.

In this case, if there are multiple front cards and/or multiple rear cards, the multiple front cards may be arranged in parallel and the multiple rear cards may be arranged in parallel.

In addition, the front card 301 and the rear card 302 are mounted with a driver 311 and a receiver 321, respectively. The driver 311 on the front card 301 and the receiver 312 on the rear card 302 are respectively coupled to the backplane connector 31 and the backplane connector 32 via the cable 54.

In the above system, the driver 311 and the receiver 321 (chip) are both referred to as transceivers. The cable 54 between the driver 311/receiver 321 and the back connector 31/32 may be implemented in various forms. The impedance controlled mechanism 53 may also be implemented in various ways.

In the above system, there may be one pair of the front card and the rear card and one pair of their corresponding transceivers. Alternatively, there may be a plurality of pairs of the front card and the rear card and a plurality of pairs of their corresponding transceivers, in which each pair may be mounted according to the above method.

In the present embodiment, if an orthogonal mounting structure is utilized in the backplane interconnection system, an array of impedance controlled mechanisms 53 may be arranged in diagonal symmetry in order to eliminate the necessity to deploy signal lines on the backplane 300 which would have otherwise affected the performance of each interconnection path.

Diagonal symmetry refers to that the array is symmetric along the diagonal of the mounting area for the backplane connector.

Figure 6A:
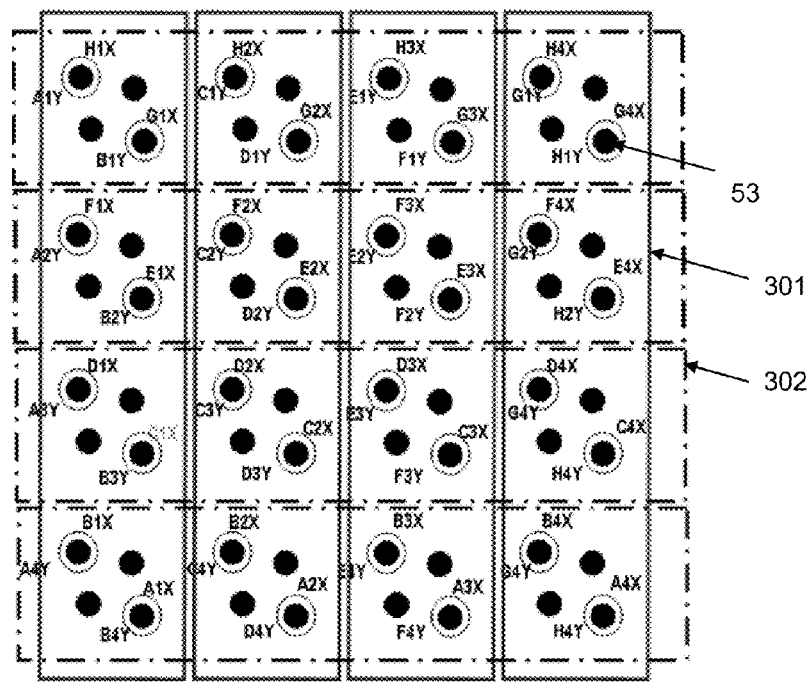
FIG. 6a illustrates mounting areas for backplane connectors, and the arrangement of pads and impedance controlled mechanisms within the mounting areas according to one embodiment of the present invention.

FIG. 6a illustrates arrangement of mounting areas for backplane connectors and the pads and impedance controlled mechanisms within the mounting areas. As illustrated in FIG. 6a, the blocks in solid line denote slots for the front card 301 while the blocks in dash and dot line denote slots for the rear card 302. The positions of the slots for the front card 301 are orthogonal to the slots for the rear card 302. Take 4*4 pairs of backplane connectors in the orthogonal backplane interconnection system as an example. A1Y, B1Y, . . . G4Y, H4Y denote signal pins of the backplane rear card. A1X, B1X, . . . G4X, H4X denote signal pins of the backplane front card. The signal pins are arranged in diagonal symmetry. In a same mounting area, i.e., the area where a front card 301 slot and a rear card 302 slot overlaps, the pads (or pins) and the impedance controlled mechanisms at two sides of the diagonal of the mounting area are symmetric along the diagonal of the mounting area.

As illustrated in FIG. 6a, a solid black circle with a circle outside denotes an impedance controlled mechanism 53. The impedance controlled mechanisms 53 are arranged in diagonal symmetry. The solid black circle without a circle outside denotes ground pins on the backplane, which may be metallized via holes for connecting the backplane connectors to the ground of the backplane.

Figure 6B:
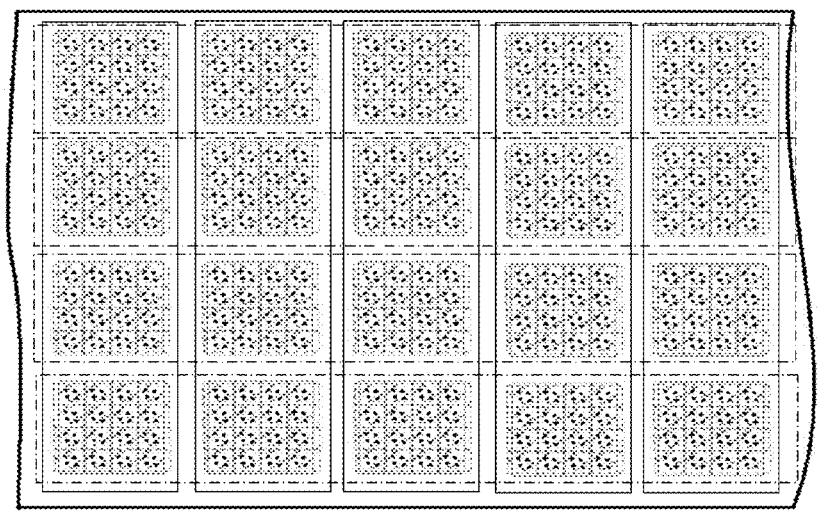
FIG. 6b illustrates the arrangement of pads and impedance controlled mechanisms on the backplane according to one embodiment of the present invention.

FIG. 6b illustrates arrangement of pads and impedance controlled mechanisms on the backplane according to one embodiment of the present invention. As illustrated in FIG. 6b, the backplane includes a plurality of mounting areas for backplane connectors. The pads and mounted impedance controlled mechanisms in each mounting area are arranged in a way as illustrated in FIG. 6a, i.e., being symmetric along the diagonal of the area.

The impedance controlled mechanism and a process for manufacturing a backplane having impedance controlled mechanism thereon will be discussed in detail according to embodiments of the present invention.

A First Embodiment of an Impedance Controlled Mechanism and a Process for Manufacturing a Backplane Having the Impedance Controlled Mechanism Thereon In the present embodiment, the impedance controlled mechanism 53 may include from inside to outside a shielding layer, a dielectric layer, and a metallic conductor. In practice, the shielding layer, the dielectric layer and the metallic conductor can be provided by various material.

The shielding layer and the dielectric layer are closing layers with a continuous side. The metallic conductor may be in a solid or hollow form, or other forms.

Figure 7A:
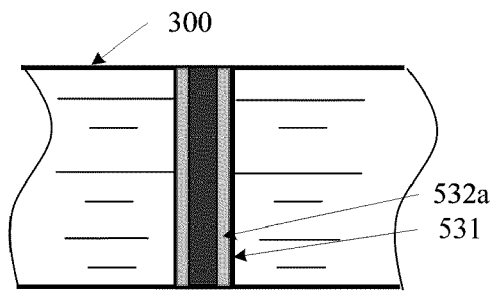
FIG. 7a is a first schematic of an impedance controlled mechanism according to a first embodiment of the present invention.

FIG. 7a is a first schematic of an impedance controlled mechanism according to the first embodiment of the present invention. As illustrated in FIG. 7a, a first type of impedance controlled mechanism according to the present embodiment includes a metallic conductor 532a with a dielectric (dark part refers to the metallic conductor and the undertint part refers to the dielectric surrounding the metallic conductor) and a metallized via hole 531 on the backplane. The metallized via hole 531 serves as a shielding layer for the impedance controlled mechanism. The metallic conductor 532a with the dielectric is inserted in the metallized via hole 531, with two ends being aligned with the surfaces of the backplane 300.

The resistance value can be determined once the size of the metallic conductor 532a with the dielectric, the inner diameter of the metallized via hole 531 and the relative dielectric constant for the dielectric are determined. Thus, the impedance is controllable. Take coaxial structure in FIG. 7a as an example of the impedance controlled mechanism. The relation between the impedance Z and the size of the structure may be defined as follow.

$$Z = \frac{60}{\sqrt{\varepsilon_r}} \ln\left(\frac{d_2}{d_1}\right)$$

where Z denotes impedance, $\varepsilon_r$ denotes relative dielectric constant for the dielectric, $d_2$ denotes the inner diameter of the metallized via hole 531 in cylindric shape and $d_1$ denotes the outer diameter of a cylindric metallic conductor which has been pressed into the metallized via hole (see the dark part of the metallic conductor 532a with the dielectric in FIG. 7a).

In the first type of impedance controlled mechanism as illustrated in FIG. 7a, the metallic conductor 532a with the dielectric is a solid substance. The metallic conductor can also be a hollow substance.

Figure 7B:
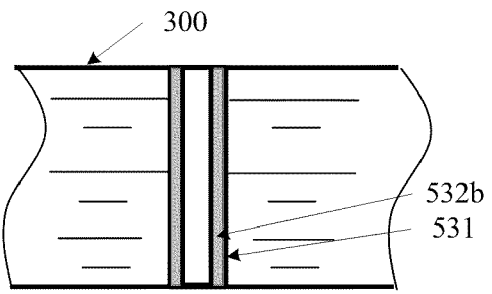
FIG. 7b is a second schematic of an impedance controlled mechanism according to a first embodiment of the present invention.

FIG. 7b is a second schematic of an impedance controlled mechanism according to the first embodiment of the present invention. As illustrated in FIG. 7b, in a second type of impedance controlled mechanism according to the present embodiment, the metallic conductor 532b with a dielectric (the dark part denotes the metallic conductor, the colorless part denotes the dielectric, and the metallic conductor is hollow) is a hollow substance.

For the second type of impedance controlled mechanism as illustrated in FIG. 7b, the relation between the impedance Z and the size of the structure may be defined as follow.

$$Z = \frac{60}{\sqrt{\varepsilon_r}} \ln\left(\frac{d_2}{d_1}\right)$$

where Z denotes impedance, $\varepsilon_r$ denotes relative dielectric constant for the dielectric, $d_2$ denotes the inner diameter of the metallized via hole 531 in cylindric shape and $d_1$ denotes the outer diameter of a cylindric hollow metallic conductor which has been pressed into the metallized via hole (see the dark part of the metallic conductor 532b with the dielectric in FIG. 7b).

Compared with the first type of impedance controlled mechanism in FIG. 7a, a second type of impedance controlled mechanism supports a backplane connector with pin connections while the first type of impedance controlled mechanism is preferably applicable to surface-mount backplane connectors for mounting on the two ends of the first type of impedance controlled mechanism.

A backplane 300 having the impedance controlled mechanism shown in FIGS. 7a and 7b can be manufactured in the following way.

a. A metallized via hole 531 is manufactured on the backplane according to traditional manufacturing approach.

In this step, the metallized via hole 531 is manufactured on the backplane at a position relative to the backplane connector to be mounted, e.g., the position relative to the pins of the backplane connector for transmitting high-speed data.

b. The metallic conductor 532 with the dielectric is pressed into the metallized via hole 531.

In this step, a force F parallel to the axis of the metallized via hole is applied in order to press the metallic conductor 532 with the dielectric into the metallized via hole 531.

c. Mechanical manufacturing is employed in order to ensure that the end face of each impedance controlled mechanism on the backplane is in a same plane with the backplane surface.

In this step, in a direction parallel to the backplane surface, a metal cutting tool 70 with an angular velocity w and a feed rate V is used to cut the portion of the impedance controlled mechanism which protrudes out of the backplane surface.

d. The surface is processed as desired. For instance, the surface may be processed by way of Immersion Silver, Immersion Tin, or gold electroplate, etc.

If the metallic conductor 532 with the dielectric has a length greater than the thickness of the backplane, the two ends of the metallic conductor 532 with the dielectric may be extruded outside the backplane surface after the metallic conductor 532 with the dielectric is pressed into the metallized via hole 531 on the backplane. Therefore, mechanical manufacturing or other manufacturing method is required to be applied on two sides of the backplane to ensure that the ends of the impedance controlled mechanism are aligned with the backplane surfaces. Alternatively, after the metallic conductor 532 with the dielectric is pressed into the metallized via hole 531 on the backplane, the metallic conductor 532 with the dielectric may be such that one end of the conductor is extruded outside the backplane surface while the other end is inside the backplane surface with a distance apart from the backplane surface. Thus, one end of the metallized via hole 531 is ensured to reserve a space inside for insertion of various connection mechanisms such as a press-fit pin so that the backplane and backplane connector are coupled in press-fit manner. Then, mechanical manufacturing is required only on one side of the backplane to ensure that the end face of the impedance controlled mechanism is aligned with the backplane surface. As such, the backplane may be connected with a backplane connector in a surface-mount manner at a side where the impedance controlled mechanism is aligned with the backplane surface while being connected with a backplane connector, for example, in a press-fit manner at the other side where the metallized via hole 531 reserves a space inside.

If the metallic conductor 532 with the dielectric has a length less than the thickness of the backplane, the metallic conductor 532 with the dielectric can be pressed into the metallized via hole 531 on the backplane by using a knock pin having a diameter less or equal to the inner diameter of the metallized via hole 531. Thus, the two ends of the metallic conductor 532 with the dielectric are both located within the backplane surface with the two ends each spaced a distance apart from the surface of the backplane. In this way, each end of the inner metallized via hole 531 reserve a space inside for insertion of various connection mechanisms such as a press-fit pin. Thus, the two sides of the backplane may be coupled to the backplane connectors, for example, in a press-fit manner. In this case, no mechanical manufacturing is required to keep the ends of the impedance controlled mechanism aligned with the backplane surfaces.

Thus, a backplane including an impedance controlled mechanism can be manufactured.

In the above solution, the process for manufacturing the backplane may include the step of pressing the metallic conductor 532 with the dielectric. In the present embodiment, this step can be replaced by an approach accommodating a traditional method for manufacturing printed slave circuit board.

Figure 8A:
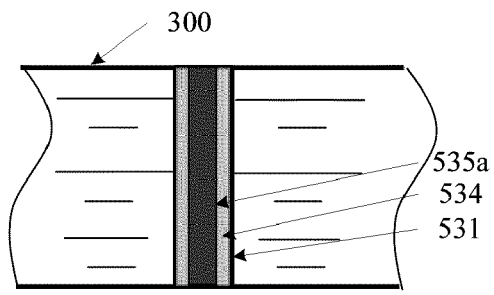
FIG. 8a is a first schematic of an impedance controlled mechanism according to a second embodiment of the present invention.
Figure 8B:
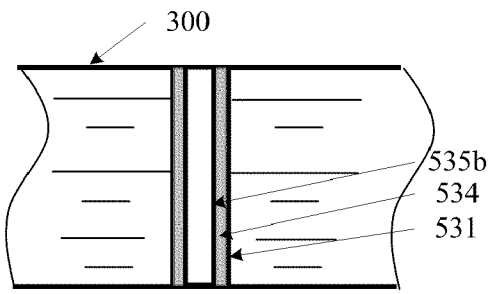
FIG. 8b is a second schematic of an impedance controlled mechanism according to a second embodiment of the present invention.

A Second Embodiment of an Impedance Controlled Mechanism and a Process for Manufacturing a Backplane Having the Impedance Controlled Mechanism Thereon FIG. 8a is a first schematic of an impedance controlled mechanism according to the second embodiment of the present invention. FIG. 8b is a second schematic of an impedance controlled mechanism according to the second embodiment of the present invention;

As illustrated in FIGS. 8a and 8b, if the backplane can be processed with an approach accommodating a traditional method for manufacturing slave circuit board, the first type of impedance controlled mechanism manufactured on the backplane may include a metallized via hole 531 on the backplane, insulated material 534 on the inner wall of the metallized via hole 531 (or may be referred to as non-metallized via hole in the metallized via hole 531) and conductor material 535a/conductor material 535b. The metallized via hole 531 is served as a shielding layer of the impedance controlled mechanism. The non-metallized via hole 534 is served as the dielectric layer of the impedance controlled mechanism. The conductive material 535a and the conductive material 535b are non-solid state material such as liquid or powder, which are served as the metallic conductor of the impedance controlled mechanism.

Referring to FIG. 8a, the conductive material 535a is filled in the non-metallized via hole 534. The non-metallized via hole 534 is inserted into the metallized via hole 531 on the backplane and the end face of the non-metallized via hole 534 is in a same plane with the surface of the backplane 300. The conductive material 535a should not be overflowed onto the surface of the backplane 300.

Referring to FIG. 8b, the conductive material 535a is covered on the inner wall of the non-metallized via hole 534. The non-metallized via hole 534 is inserted into the metallized via hole 531 on the backplane and the end face of the non-metallized via hole 534 is in a same plane with the surface of the backplane 300. The conductive material 535b should not be overflowed onto the surface of the backplane 300.

The impedance value can be determined once the inner diameter of the metallized via hole 531c, the inner diameter of the non-metallized via hole 534 and the relative dielectric constant for the dielectric are determined. Thus, the impedance is controllable. The relation between impedance Z and the size can refer to the impedance controlled mechanism illustrated in FIGS. 7a and 7b.

A backplane 300 having the impedance controlled mechanism thereon as illustrated in FIGS. 8a and 8b can be manufactured in the following way.

a. A traditional metallized via hole 531 is manufactured on the backplane.

In this step, the metallized via hole 531 is manufactured on the backplane at a position relative to the backplane connector to be mounted, e.g., the position relative to the pins of the backplane connector for transmitting high-speed data.

b. The insulated material 533 is injected to the via hole 531. By way of example, the insulated material may be insulated resin for use in the printed slave circuit board.

c. The non-metallized via hole 534 having a corresponding inner diameter is manufactured in the insulated material according to the impedance requirement.

d. A conductive material 535a (solid structure) is injected into the non-metallized via hole as required. Alternatively, the non-metallized via hole 534 can be metallized using an electroplate approach. That is, the inner wall of the non-metallized via hole 534 is covered with conductive material 535b (hollow structure).

In practice, between step b and step c or after step d, a part of the insulated material 533 in the metallized via hole 531 at one end or two ends can be removed by mechanical manufacturing such as by perforation or other manufacturing method. Thus, one end or two ends of the metallized via hole 531 may have a space for insertion of various connection mechanisms such as a press-fit pin so that the backplane and backplane connector can be connected in press-fit manner. Consequently, the backplane may be coupled to the backplane connector in a surface-mount manner or in a press-fit pin manner, for example.

Thus, a backplane including an impedance controlled mechanism can also be manufactured.

On the backplane, the impedance controlled mechanism is used to replace the traditional metallized via hole. Since the impedance value of the impedance controlled mechanism is set based on the actual circuit environment and the impedance is stable and is not subject to interference, the issue of impedance incontinuity as a result of the traditional via hole can be overcome when the signal is transmitted via the impedance controlled mechanism. Meanwhile, since the impedance controlled mechanism has a metal shielding layer outside, crosstalk among the impedance controlled mechanism in each interconnection path can be eliminated, which overcomes the prior art problem of crosstalk among the interconnection paths due to the crosstalk among the via holes on the backplane.

Detailed explanation is made to various backplane interconnection systems in various embodiments considering the different connection approaches for connecting between the cables and the driver/receiver and between the cables and the backplane connectors, and the approach for connecting backplane connectors at two sides of the backplane. The following embodiments are focused on orthogonal backplane interconnection system. Pads within the mounting areas for the backplane connectors on the backplane may also be arranged in diagonal symmetry as described above. The impedance controlled mechanisms mounted on the backplane may be in the form as illustrated in FIG. 7a, or 7b or 8a or 8b, or in other form. A corresponding mounting method is employed for mounting the impedance controlled mechanisms onto the backplane.

A First Embodiment of the Backplane Interconnection System

In this embodiment, the connection between the cable and the driver/receiver and the connection between the cable and the backplane connectors are implemented by cable connectors and a press-fit pin mechanism. The backplane connectors are coupled to the backplane via the press-fit pin mechanism.

Figure 9:
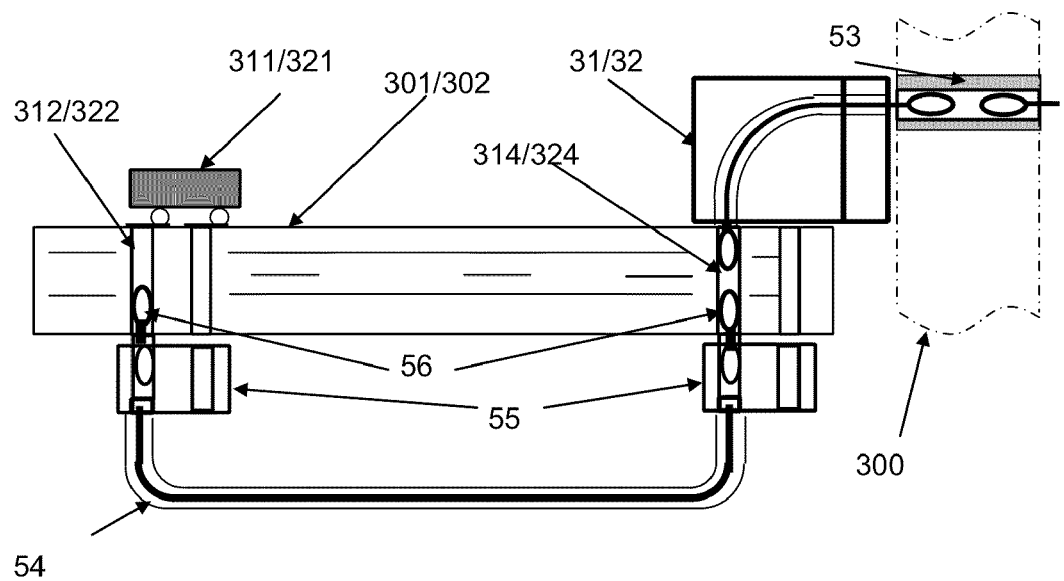
FIG. 9 is a mounting structure schematic of a backplane interconnection system according to a first embodiment of the present invention.

FIG. 9 is a mounting structure of a backplane interconnection system according to a first embodiment of the present invention; as illustrated in FIG. 9, the backplane interconnection system according to the present embodiment may include a front card 301, a driver 311 on the front card 301, a backplane 300, a rear card 302, a receiver 321 on the rear card 302, a backplane connector 31, a backplane connector 32 and cable connectors 55.

The front card 301/rear card 302 is perpendicular to the backplane 300 and the front card 301 is orthogonal to the rear card 302.

The cable connectors 55 are mounted on the front card 301/rear card 302 and are not at the same side with the driver 311/receiver 321 on the front card 301/rear card 302. Moreover, the driver 311/receiver 321 and the backplane connector 31/32 are located at the same side of the front card 301/rear card 302.

Two ends of the cable 54 are coupled to two cable connectors 55, respectively. The cable connector at one end of the cable 54 is press-fitted via a press-fit pin 56 into the via hole 312/322 welded to the driver 311/receiver 321. The cable connector 55 at the other end of the cable 54 and the backplane connector 31/32 are press-fitted via the press-fit pin 56 into the same via hole 314/324 on the front card 301/rear card 302. In addition, the other end of the press-fit pin 56 in the backplane connector 31/32 penetrates from the side where the backplane connector 31/32 contacts the front card 301/rear card 302 to the side where the backplane connector 31/32 contacts the backplane 300 and is press-fitted into the impedance controlled mechanism 53 on the backplane 300. Therefore, the driver 311/receiver 321 is coupled to the backplane connector 31/32 via the cable connector 55 and the cable 54.

In the present embodiment, because the backplane connector 31/32 is coupled to the impedance controlled mechanism 53 via the press-fit pin, the impedance controlled mechanism 53 in the present embodiment is preferably in the form of a hollow impedance controlled mechanism as illustrated in FIG. 7b or 8b. If the solid impedance controlled mechanism as illustrated in FIG. 7a is adopted, the metallic conductor 532 with the dielectric in this structure should have a length shorter than the thickness of the backplane so that one end of the press-fit pin can be inserted. If the solid impedance controlled mechanism as illustrated in FIG. 8a is adopted, the room for inserting the press-fit pin 56 should be reserved likewise.

In practice, the cable 54 mounted on the cable connectors 55 may be in a conductive connection with the press-fit pin 56 in various manners. For instance, the cable 54 may be in conductive connection with the press-fit pin 56 via the via hole in the cable connector 55 or by welding a conducting wire to the end where the press-fit pin 56 is press-fitted to the cable connector 55.

Thus, the interconnection path from the driver 311 to the backplane 300 sequentially goes through the via hole 312 on the front card 301, the cable connector 55, the cable 54, the cable connector 55, the via hole 314 on the front card 301, the impedance controlled mechanism 53 coupling the backplane connector 31 to the backplane. The interconnection path from the receiver 321 to the backplane 300 is similar.

Therefore, in the backplane interconnection system according to the present embodiment, the signal is transmitted via the cable 54 on the front card 301 and the rear card 302 and the impedance controlled mechanism 53 on the backplane 300 instead of being transmitted via the differential signal line 313/323 on the front card 301/rear card 302 and the signal line and the via hole 30 on the backplane according to a conventional solution. Compared with the signal transmitted through the differential signal line, the signal transmitted through the high-speed cable may be subject to lessened signal attenuation and the signal transmission delay is stable. Therefore, the signal attenuation on each interconnection path is minor and the delay on each interconnection path is substantially the same. Because the impedance value of the impedance controlled mechanism on each interconnection path is set depending on the actual circuit environment, the impedance is stable and is not subject to interference. Thus, the impedance continuity for each interconnection path is enhanced. Moreover, because the impedance controlled mechanism has a shielding layer, each interconnection path including the impedance controlled mechanism may not suffer from the crosstalk caused by the via hole on the backplane according to the conventional solution.

Furthermore, in the present embodiment, a press-fit pin method is used for connection. The connection method is a conventional technical solution which is easy to accomplish. In addition, with this connection method, each component in the backplane interconnection system can be mounted and demounted flexibly.

In the backplane interconnection system of the present embodiment, one or more connection mechanisms employing the press-fit pin method may be replaced with other connection mechanism described in the following embodiments of the backplane interconnection system. It is to be noted that not all of the connection mechanisms in the system need to take the form of such connection mechanism.

A Second Embodiment of the Backplane Interconnection System

In the present embodiment, the backplane connectors are connected to the backplane in a surface-mount manner. For instance, welding or pressure-fit connection can be employed. Considering the elastic pin of the connector, a force is applied on the connector so as to ensure that the signal pins of the connector is in conductive connection with the impedance controlled path on the backplane.

Figure 10:
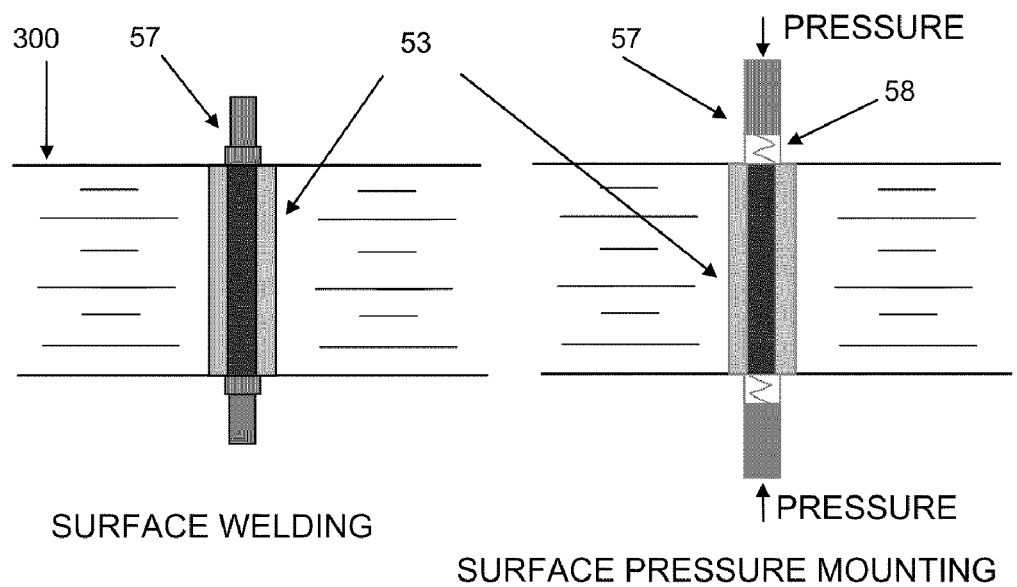
FIG. 10 is a mounting structure schematic of a backplane interconnection system according to a second embodiment of the present invention.

FIG. 10 is a mounting structure of a backplane interconnection system according to a second embodiment of the present invention. As illustrated in FIG. 10, in the backplane interconnection system according to the present embodiment, one end of the impedance controlled mechanism 53 on the backplane 300 may be welded to a surface-mount signal pin 57. The surface-mount signal pin 57 may also be coupled to the impedance controlled mechanism 53 by virtue of a spring 58 and be in contact with the impedance controlled mechanism 53 by a pressure applied perpendicular to the surface of the backplane 300.

The surface-mount signal pin 57 coupled to the impedance controlled mechanism 53 is then coupled to the backplane connector 31/32, for instance, by inserting into the backplane connector 31/32.

Because in the present embodiment, a surface-mount manner is utilized to realize the connection between the impedance controlled mechanism 53 and the backplane connector 31/32, the impedance controlled mechanism 53 on the backplane 300 is preferably in a solid structure as illustrated in FIG. 7a or 8a so as to ensure that the impedance controlled mechanism 53 may fully contact the surface-mount signal pin 57.

Thus, the interconnection path between the backplane connector 31 and the backplane connector 32 on the two sides of the backplane 300 goes through the surface-mount signal pin 57, the impedance controlled mechanism 53 and the surface-mount signal pin 57.

Therefore, in the backplane interconnection system according to the present embodiment, the signal is transmitted via the impedance controlled mechanism 53 on the backplane 300 instead of being transmitted via the differential signal line 313/323 and the via hole 30 on the backplane 300 according to a conventional solution. Because the impedance value of the impedance controlled mechanism in each interconnection path is set depending on the actual circuit environment, the impedance is stable and is not subject to interference. Thus, the impedance continuity for each interconnection path is enhanced. Moreover, because the impedance controlled mechanism has a shielding layer, each interconnection path including the impedance controlled mechanism may not suffer from the crosstalk caused by the via hole on the backplane according to the conventional solution.

Moreover, because in the present embodiment a surface-mount manner is employed for the connection, the backplane does not need to be very thick, which reduces the system cost.

In the present embodiment, the backplane connector is coupled to the backplane in a surface-mount manner. A press-fit pin manner as described in the first embodiment of the backplane interconnection system may be utilized in the other connection mechanism. Alternatively, other connection method as will be described in the following embodiment of the backplane interconnection system can be utilized.

A Third Embodiment of the Backplane Interconnection System

In the present embodiment, the impedance controlled mechanism may be divided into two parts which are arranged respectively on the two backplane connectors at the two sides of the backplane.

Figure 11:
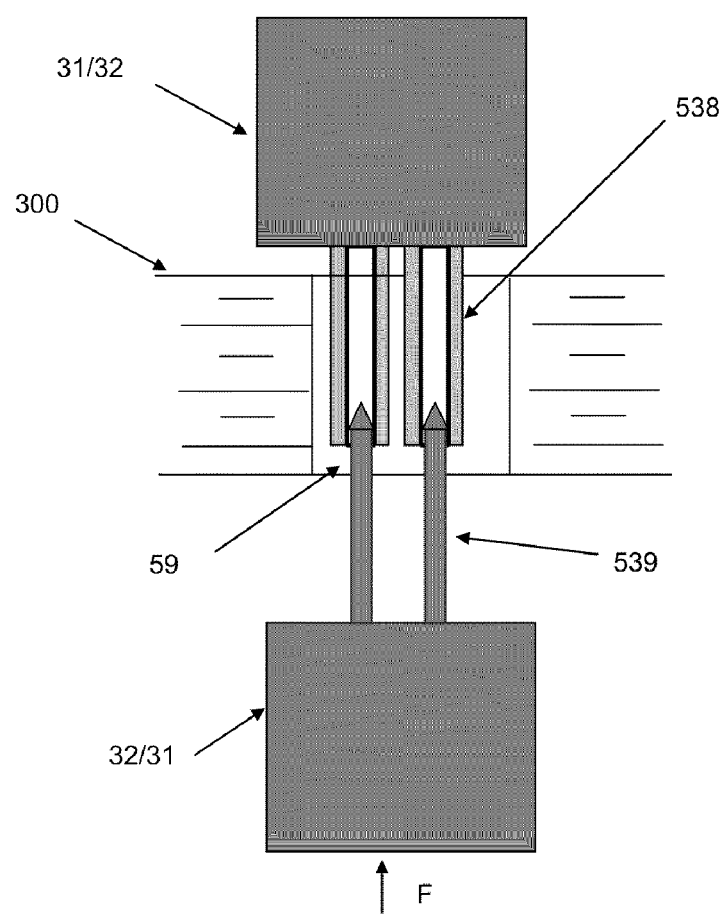
FIG. 11 is a mounting structure schematic of a backplane interconnection system according to a third embodiment of the present invention.

FIG. 11 is a mounting structure schematic diagram of a backplane interconnection system according to a third embodiment of the present invention. As illustrated in FIG. 11, an example that two backplane connectors are coupled to each other via two impedance controlled mechanisms is provided. In the backplane interconnection system according to the present embodiment, the backplane 300 includes a through hole 59. The backplane connector 31/32 on one side of the backplane 300 includes two hollow penetrating pin portions 538 and the backplane connector 32/31 on the other side of the backplane 300 includes two penetrating pin portions 539.

The hollow penetrating pin portions 538 and penetrating pin portions 539 are located respectively at a position on the backplane connector 31/32 and the backplane connector 32/31 for transmitting signal. The hollow penetrating pin portion 538 on the backplane connector 31/32 is a hollow substance made from metal material (for example, a hollow cylinder in a coaxial structure, i.e., the hollow portion can also be in a cylinder shape). The outer size (outer diameter) of the hollow penetrating pin portion 538 may be smaller than the size of the through hole 59 on the backplane. The inner wall may be covered with a dielectric layer (dark portion). The penetrating pin portion 539 on the other backplane connector 32/31 is a metallic conductor (e.g., a metallic conductor in a cylinder shape. The conductor may be a solid substance, such as a cylinder, or may be a hollow substance in a coaxial structure). The outer size (outer diameter) of the penetrating pin portion 539 may be smaller than or equal to the inner size (inner diameter) of the dielectric layer of the hollow penetrating pin portion 538.

The inner wall of the dielectric layer of the hollow penetrating pin portion 538 may also be covered with a metallic conductor layer (the metallic conductor layer is in conductive connection with a corresponding portion on the backplane connector 31/32, for instance, the portion for transmitting signals). Thus, the penetrating pin portion 539 inserting into the hollow penetrating pin portion 538 may be in conductive connection with the backplane connector 31/32 with the hollow penetrating pin and the backplane connector 32/31 with the penetrating pin by virtue of the metallic conductor layer and the bottom (metal material) of hollow penetrating pin portion 538.

Alternatively, the bottom of the hollow penetrating pin portion 538 (the position corresponding to the associated portion of the backplane connector 32/31) is mounted with a metal spring contact. The end of the inserted penetrating pin portion 539 can be in contact with the metal spring contact. Thus, the backplane connector 31/32 with a hollow penetrating pin can be in conductive connection with the backplane connector 32/31 with the penetrating pin.

Alternatively, the penetrating pin portion 539 is ensured to have a length which is the same as the depth of the hollow penetrating pin portion 538 so that the end of the inserted penetrating portion 539 can be in contact with the bottom of the hollow penetrating pin portion 538 (the position corresponding to the associated portion of the backplane connector 32/31). As a result, the backplane connector 31/32 with the hollow penetrating pin is in conductive connection with the backplane connector 32/31 with the penetrating pin.

In the above three solutions for connecting the hollow penetrating pin and the penetrating pin portion, the one with a metallic conductor layer covering the dielectric layer has the highest reliability.

At the through hole 59 on the backplane, the penetrating pin portion 539 is inserted under a pressure F into the dielectric layer of the hollow penetrating pin portion 538. That is, a connector assembly including the backplane connector 31 and the backplane connector 32 constitutes the impedance controlled mechanism including a shielding layer, dielectric layer and metallic conductor. At the meantime, the connection between the backplane connector 31 and the backplane connector 32 is realized.

Thus, the interconnection path between the backplane connectors on two sides of the backplane only includes an impedance controlled mechanism.

Therefore, in the backplane interconnection system according to the present embodiment, the signal is transmitted via an impedance controlled mechanism 53 including a hollow penetrating pin portion 538 on the backplane connector 31/32 and a penetrating pin portion 539 on the backplane connector 32/31 instead of being transmitted via the differential signal line 313/323 and the via hole 30 on the backplane according to a conventional solution. Because the impedance value of the impedance controlled mechanism in each interconnection path is set depending on the actual circuit environment, the impedance is stable and is not subject to interference. Thus, the impedance continuity for each interconnection path is enhanced. Moreover, because the impedance controlled mechanism has a shielding layer, each interconnection path including the impedance controlled mechanism may not suffer from the crosstalk caused by the via hole on the backplane according to the conventional solution.

Moreover, the present embodiment eliminates the necessity to mount the impedance controlled mechanism on the backplane and thus simplifies the process for manufacturing the backplane by providing a hollow penetrating pin portion 538 and a penetrating pin portion 539 on two backplane connectors at two sides of the backplane.

In the present embodiment, the backplane connectors at two sides of the backplane are coupled together by a hollow penetrating pin portion and a penetrating pin portion. In the other connection mechanism, a press-fit pin structure may be utilized as described in the first embodiment of the backplane interconnection system. Alternatively, other connection method as will be described in the following embodiments of the backplane interconnection system can be utilized.

A Fourth Embodiment of the Backplane Interconnection System

In the present embodiment, various traditional surface-mount structures such as Ball Grid Array (BGA) are adopted in the receiver (chip). The cable is let out of a pad of a chip pin by virtue of a microstrip which is then coupled to the cable via the cable connector.

Figure 12:
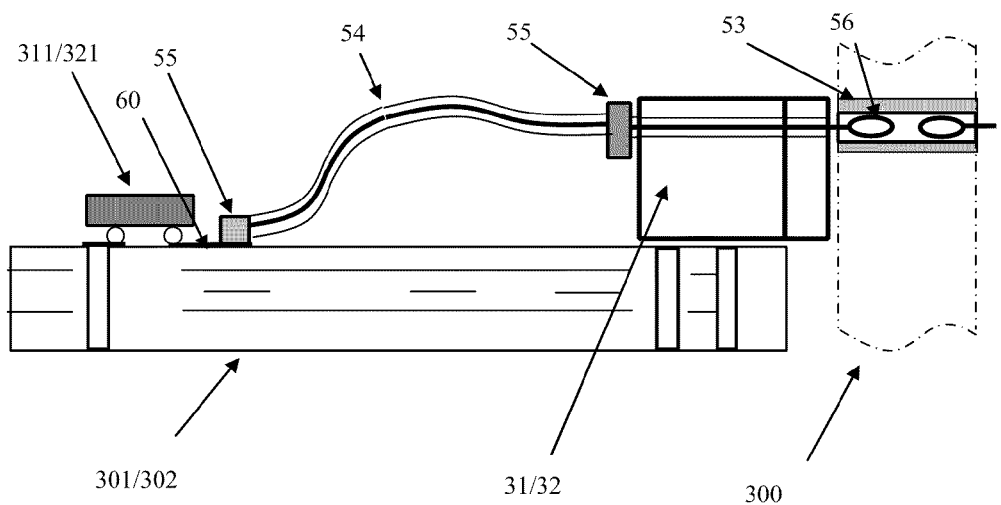
FIG. 12 is a first mounting structure schematic of a backplane interconnection system according to a fourth embodiment of the present invention.

FIG. 12 is a first mounting structure of a backplane interconnection system according to the fourth embodiment of the present invention. As illustrated in FIG. 12, the backplane interconnection system according to the present embodiment may include a front card 301, a driver 311 on the front card 301, a backplane 300, a rear card 302, a receiver 321 on the rear card 302, a backplane connector 31, a backplane connector 32 and a cable connector 55.

The front card 301/rear card 302 is perpendicular to the backplane 300 and the front card 301 is orthogonal to the rear card 302.

The cable connector 55, the driver 311/receiver 321, and the backplane connector 31/32 are located at the same side of the front card 301/rear card 302.

The driver 311/receiver 321 is coupled to the backplane connector 31/32 via the cable connector 55 and the cable 54. Two ends of the cable 54 are coupled to two cable connectors 55, respectively. The cable connector 55 at one end of the cable 54 is coupled via a microstrip 60 (by welding) to the pad of the pin of the driver 311/receiver 321 (e.g., pin of the data bus). The cable connector 55 at the other end of the cable 54 is mounted on the surface where the backplane connector 31/32 is perpendicular to the front card 301/rear card 302 and on the surface which is close to the driver 311/receiver 321.

The cable connector 55 mounted on the backplane connector 31/32 is coupled to the press-fit pin 56 in the impedance controlled mechanism 53 press-fitted on the backplane 300 by penetrating the conducting wire of the backplane connector 31/32. In the present embodiment, the backplane connector 31/32 may be coupled to the impedance controlled mechanism 53 on the backplane 300 in a manner described in the second embodiment or the third embodiment. In this case, the cable connector 55 mounted on the backplane connector 31/32 is coupled to the surface-mount signal pin 57 on the backplane 300 or coupled to the hollow penetrating pin portion 538/penetrating pin portion 539 on the backplane connector 31/32 by penetrating the conducting wire of the backplane connector 31/32.

Figure 13:
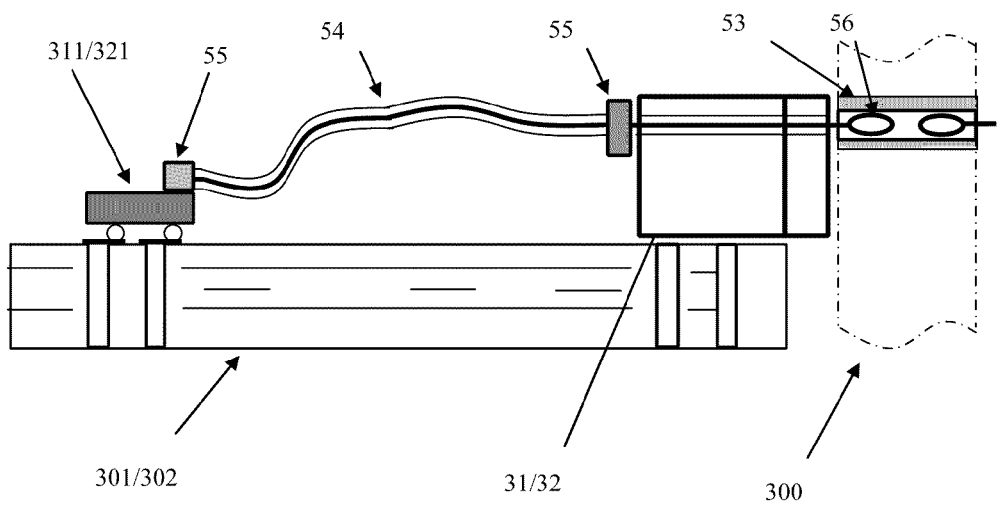
FIG. 13 is a second mounting structure schematic of a backplane interconnection system according to a fourth embodiment of the present invention.

FIG. 13 is a second mounting structure of a backplane interconnection system according to the fourth embodiment of the present invention. As illustrated in FIG. 13, in the backplane interconnection system according to the embodiment of the present invention, the cable connector 55 may not be coupled to the pads of the driver 311/receiver 321 (chip) to realize the connection with the driver 311/receiver 321. Rather, the cable connector 55 may be mounted on the top of the driver 311/receiver 321 (chip) so that the cable 54 can be directly led out of the pin (e.g., the pin of the data bus) by virtue of a microstrip like structure, i.e., in a surface-mount manner.

Thus, the interconnection path from the driver 311 to the backplane 300 sequentially goes through the cable connector 55 on the front card 301, the cable 54, the cable connector 55, the backplane connector 31, to the impedance controlled mechanism 53. The interconnection path from the receiver 321 to the backplane 300 is similar.

Therefore, in the backplane interconnection system according to the present embodiment, the signal is transmitted via the cable 54 on the front card 301 and rear card 302 and the impedance controlled mechanism 53 on the backplane 300 instead of being transmitted via the differential signal line 313/323 on the front card 301/rear card 302 and the signal line and the via hole 30 on the backplane 300 according to a conventional solution. Compared with the signal transmitted through the differential signal line, the signal transmitted through the high-speed cable may be subject to lessened signal attenuation and the signal transmission delay is stable. Therefore, the signal attenuation on each interconnection path is minor and the delay on each interconnection path is substantially the same. Because the impedance value of the impedance controlled mechanism on each interconnection path is set depending on the actual circuit environment, the impedance is stable and is not subject to interference. Thus, the impedance continuity for each interconnection path is enhanced. Moreover, because the impedance controlled mechanism has a shielding layer, each interconnection path including the impedance controlled mechanism may not suffer from the crosstalk caused by the via hole on the backplane according to the conventional solution.

Moreover, in the present embodiment, the cable, driver 311/receiver 321 and the backplane connector 31/32 are mounted at the same side of the front card 301/rear card 302. One end of the cable is directly coupled to the driver 311/receiver 321 without going through the front card 301/rear card 302. A press-fit pin manner is employed on the other end of the cable for the connection. The signal transmitted does not need to go through the via hole on the front card 301/rear card 302, which further minimizes the interference on the interconnection path, and thus enhancing the transmission performance of the interconnection path.

In the present embodiment, one or more connection mechanisms may also be replaced by the connection mechanisms of the first embodiment or of the following embodiments of the backplane interconnection system. It is to be noted that not all of the connection mechanisms in the system need to take the form of such connection mechanism.

A Fifth Embodiment of the Backplane Interconnection System

In the present embodiment, the impedance controlled mechanism is used to substitute the via hole on the front card and the rear card as the slave circuit board.

Figure 14:
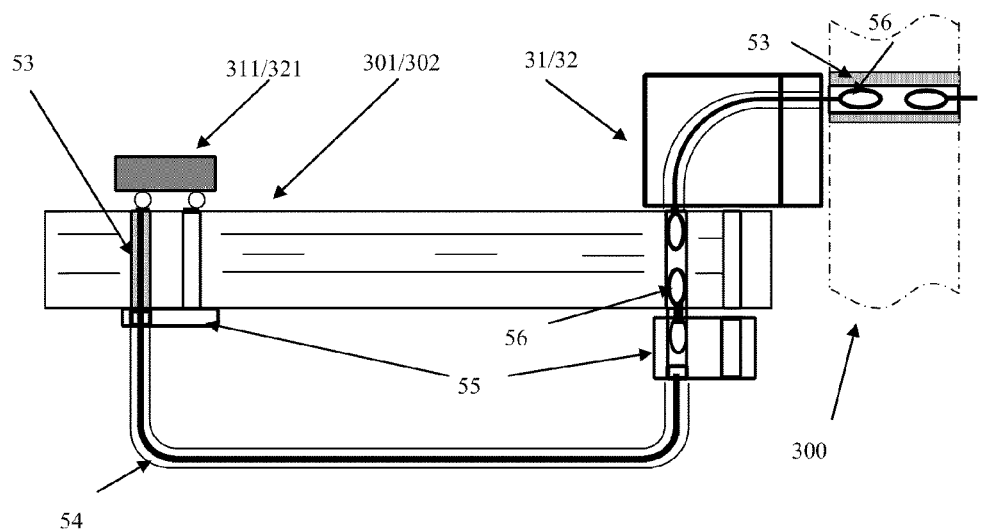
FIG. 14 is a first mounting structure schematic of a backplane interconnection system according to a fifth embodiment of the present invention.

FIG. 14 is a first mounting structure of a backplane interconnection system according to the fifth embodiment of the present invention. As illustrated in FIG. 14, the backplane interconnection system according to the present embodiment may include a front card 301, a driver 311 on the front card 301, a backplane 300, a rear card 302, a receiver 321 on the rear card 302, a backplane connector 31, a backplane connector 32 and a cable connector 55.

The front card 301/rear card 302 is perpendicular to the backplane 300 and the front card 301 is orthogonal to the rear card 302.

The cable connectors 55 are mounted on the front card 301/rear card 302 and are not at the same side with the driver 311/receiver 321 in relative to the front card 301/rear card 302. Moreover, the driver 311/receiver 321 and the backplane connector 31/32 are located at the same side of the front card 301/rear card 302.

The two ends of the cable 54 are coupled to two cable connectors 55, respectively. The cable connector at one end of the cable 54 is surface-mounted on the impedance controlled mechanism 53 coupled (by welding) to the driver 311/receiver 321. That is, the impedance controlled mechanism is used to replace the via hole 312/322 on the front card 301/rear card 302. The cable connector 55 at the other end of the cable 54 and the backplane connector 31/32 are press-fitted via the press-fit pin 56 into the same via hole 314/324 on the front card 301/rear card 302. In addition, the other end of the press-fit pin 56 in the backplane connector 31/32 penetrates from the side where the backplane connector 31/32 contacts the front card 301/rear card 302 to the side where the backplane connector 31/32 contacts the backplane 300 and is press-fitted into the impedance controlled mechanism 53 on the backplane 300. Therefore, the driver 311/receiver 321 is coupled to the backplane connector 31/32 via the cable connector 55 and the cable 54.

In the present embodiment, if the backplane connector 31/32 is coupled to the impedance controlled mechanism 53 via the press-fit pin 56, the impedance controlled mechanism 53 in the present embodiment is preferably in the form of a hollow impedance controlled mechanism as illustrated in FIG. 7b or 8b. If the solid impedance controlled mechanism as illustrated in FIG. 7a is adopted, the metallic conductor with the dielectric in this structure should have a length shorter than the thickness of the backplane so that one end of the press-fit pin can be inserted. If the solid impedance controlled mechanism as illustrated in FIG. 8a is adopted, the room for inserting the press-fit pin should be reserved likewise.

In practice, the cable 54 mounted on the cable connectors 55 may be in a conductive connection with the press-fit pin in various manners. For instance, the cable 54 may be in conductive connection with the press-fit pin 56 via the via hole in the cable connector 55 or by welding a conducting wire to the end where the press-fit pin 56 is press-fitted to the cable connector 55.

Figure 15:
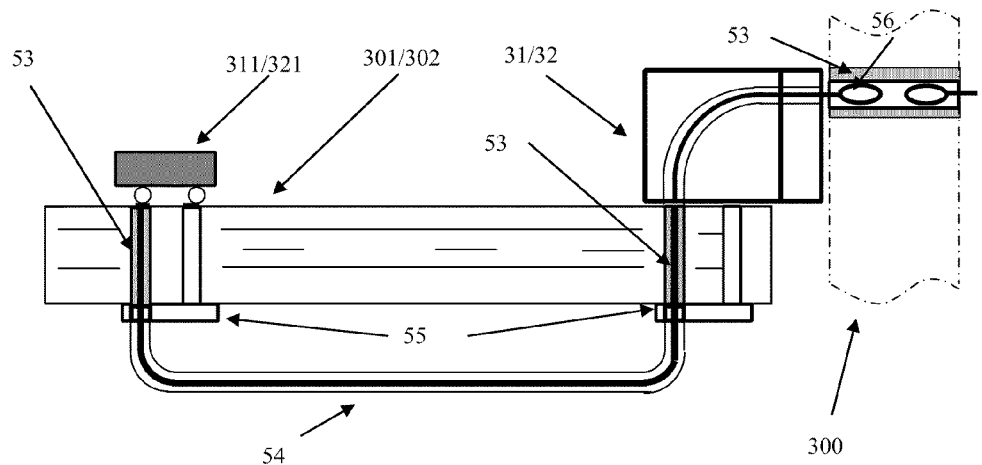
FIG. 15 is a second mounting structure schematic of a backplane interconnection system according to a fifth embodiment of the present invention.

FIG. 15 is a second mounting structure of a backplane interconnection system according to the fifth embodiment of the present invention. As illustrated in FIG. 15, the backplane interconnection system according to the present embodiment may include a front card 301, a driver 311 on the front card 301, a backplane 300, a rear card 302, a receiver 321 on the rear card 302, a backplane connector 31, a backplane connector 32 and a cable connector 55.

The front card 301/rear card 302 is perpendicular to the backplane 300 and the front card 301 is orthogonal to the rear card 302.

The second mounting structure illustrated in FIG. 15 differs from the first mounting structure illustrated in FIG. 14 in that the cable connector 55 at the other end of the cable 54 does not use a press-fit pin 56 for connecting to the backplane connector 31/32. Rather, the second mounting structure illustrated in FIG. 15 is surface-mounted on the impedance controlled mechanism 53 coupled (e.g., by welding) to the backplane connector 31/32. That is, the impedance controlled mechanism 53 is used to replace the via hole 314/324 on the front card 301/rear card 302.

Thus, in the backplane interconnection system as illustrated in FIG. 14 or FIG. 15, the interconnection path from the driver 311 to the backplane 300 sequentially goes through the impedance controlled mechanism 53 on the front card 301, cable connector 55, the cable 54, the cable connector 55, the via hole 314 on the front card (first mounting structure)/impedance controlled mechanism 53 (second mounting structure), the impedance controlled mechanism 53 coupling the backplane connector 31 to the backplane. The interconnection path from the receiver 321 to the backplane 300 is similar.

Therefore, in the backplane interconnection system according to the present embodiment, the signal is transmitted via the impedance controlled mechanism 53 and the cable 54 on the front card 301 and rear card 302 and the impedance controlled mechanism 53 on the backplane 300 instead of being transmitted via the via 312/322, the via 314/324, and the differential signal line 313/323 on the front card 301/rear card 302 and the signal line 313/323 and the via hole 30 on the backplane 300 according to a conventional solution. Compared with the signal transmitted through the differential signal line, the signal transmitted through the high-speed cable may be subject to a lessened signal attenuation and the signal transmission delay is stable. Therefore, the signal attenuation on each interconnection path is minor and the delay on each interconnection path is substantially the same. Because the impedance value of the impedance controlled mechanism on each interconnection path is set depending on the actual circuit environment, the impedance is stable and is not subject to interference. Thus, the impedance continuity for each interconnection path is enhanced. Moreover, because the impedance controlled mechanism has a shielding layer, each interconnection path including the impedance controlled mechanism may not suffer from the crosstalk caused by the via hole on the backplane according to the conventional solution.

Compared with other embodiment of the backplane interconnection system, the impedance controlled mechanism 53 on the front card 301/rear card 302 is further employed in the present embodiment, which further improves the continuity of the impedance and enhances the transmission performance of the interconnection path.

In the backplane interconnection system according to the present embodiment, the impedance controlled mechanism 53 on the front card 301/rear card 302 may also be replaced with other connection mechanism in the other embodiments of the backplane interconnection system. It is to be noted that not all of the connection mechanisms in the system need to take the form of such connection mechanism.

A Sixth Embodiment of the Backplane Interconnection System

In the present embodiment, the cable for connecting the driver/receiver and the backplane connector is buried in the front card 301/rear card 302, and no cable connector is required.

Figure 16:
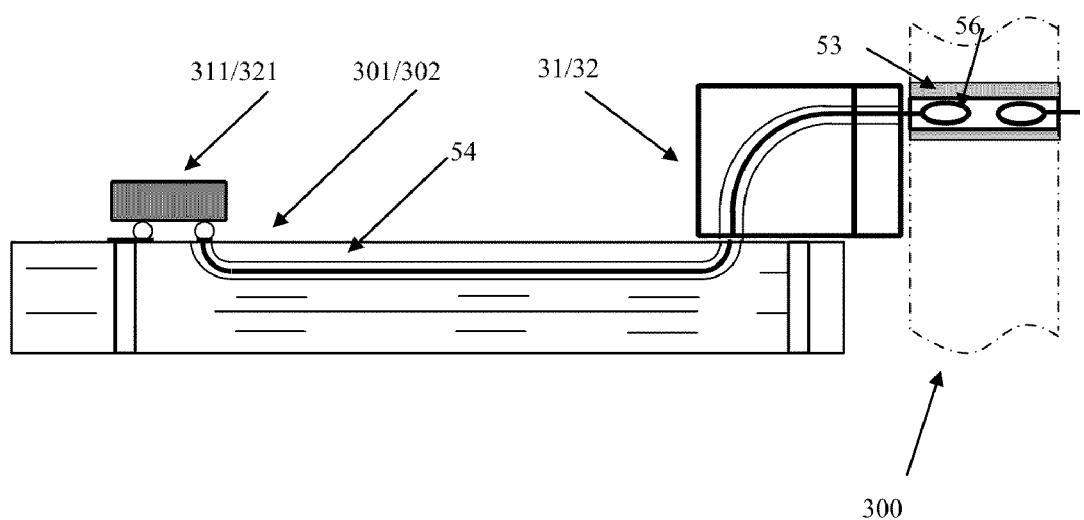
FIG. 16 is a mounting structure schematic of a backplane interconnection system according to a sixth embodiment of the present invention.

FIG. 16 is a mounting structure of a backplane interconnection system according to the sixth embodiment of the present invention. As illustrated in FIG. 16, the backplane interconnection system according to the present embodiment may include a front card 301, a driver 311 on the front card 301, a backplane 300, a rear card 302, a receiver 321 on the rear card 302, a backplane connector 31, and a backplane connector 32.

The front card 301/rear card 302 is perpendicular to the backplane 300 and the front card 301 is orthogonal to the rear card 302. The backplane connector 31/32 is surface-mounted on the front card 301/rear card 302.

The cable 54 is buried in the front card 301/rear card 302, with one end directly coupling (e.g., by welding) to the pin (e.g., pin of the data bus) of the driver 311/receiver 321. The other end of the cable 54 penetrates from the side where the backplane connector 31/32 contacts the front card 301/rear card 302 to the side where the backplane connector 31/32 contacts the backplane 300 and is coupled to the press-fit pin 56 which is press-fitted to the impedance controlled mechanism 53 on the backplane 300.

In the present embodiment, if the backplane connector 31/32 is coupled to the impedance controlled mechanism 53 via the press-fit pin 56, the impedance controlled mechanism 53 in the present embodiment is preferably in the form of a hollow impedance controlled mechanism illustrated in FIG. 7b or 8b. If the solid impedance controlled mechanism as illustrated in FIG. 7a is adopted, the metallic conductor with the dielectric in this structure may have a length shorter than the thickness of the backplane so that one end of the press-fit pin can be inserted. If the solid impedance controlled mechanism as illustrated in FIG. 8a is adopted, the room for inserting the press-fit pin 56 should be reserved likewise.

Thus, the interconnection path from the driver 311 to the backplane 300 goes through the cable 54 and the impedance controlled mechanism 53 from the backplane connector 31 to the backplane 300. The interconnection path from the receiver 321 to the backplane 300 is similar.

Therefore, in the backplane interconnection system according to the present embodiment, the signal is not transmitted via the differential signal line 313/323 on the front card 301/rear card 302 nor transmitted via the signal line and the via hole 30 on the backplane 300. Compared with the signal transmitted through the differential signal line, the signal transmitted through the high-speed cable may be subject to a lessened signal attenuation and the signal transmission delay is stable. Therefore, the signal attenuation on each interconnection path is minor and the delay on each interconnection path is substantially the same. Because the impedance value of the impedance controlled mechanism on each interconnection path is set depending on the actual circuit environment, the impedance is stable and is not subject to interference. Thus, the impedance continuity for each interconnection path is enhanced. Moreover, because the impedance controlled mechanism has a shielding layer, each interconnection path including the impedance controlled mechanism may not suffer from the crosstalk caused by the via hole on the backplane according to the conventional solution.

Furthermore, according to the present embodiment, the cable 54 is buried in the front card 301/rear card 302. Therefore, the signal can be transmitted without passing through the via hole 312/322 on the front card 301/rear card 302 and the via 314/324, which further minimizes the interference on the interconnection path. In addition, the cable 54 is prevented from being cut off by force due to being exposed to the surface of the front card 301/rear card 302. Thus, the transmission performance and reliability of the interconnection path is further improved.

In the backplane interconnection system according to the present embodiment, each connection mechanism may also be replaced with the connection mechanism in the other embodiments of the backplane interconnection system. It is to be noted that not all of the connection mechanisms in the system need to take the form of such connection mechanism.

Figure 17:
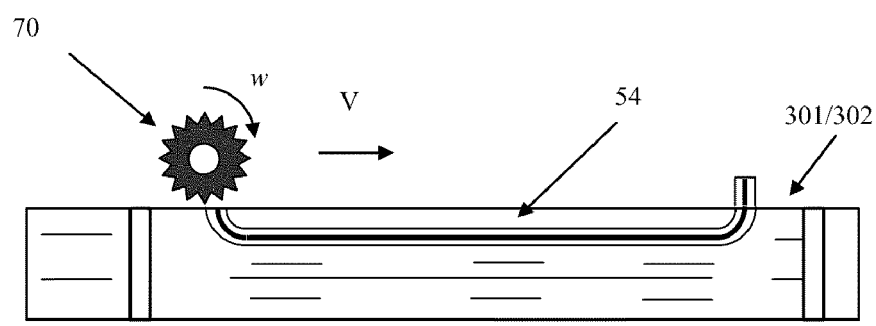
FIG. 17 is an illustration of a coplanar processing for cables and circuit board surface according to a sixth embodiment of the backplane interconnection system of the present invention.

FIG. 17 is an illustration of a coplanar processing for cables and circuit board surface according to a sixth embodiment of the backplane interconnection system of the present invention. As illustrated in FIG. 17, the cable 54 is buried in the front card 301/rear card 302 and the two ends of the cable 54 are kept in a same plane with the front card 301/rear card 302. The process includes the following steps.

a. The cable 54 passes through the path or groove which is in the front card 301/rear card 302 and is manufactured in advance.

b. The coplanarity of the cable 54 penetrating the front card 301/rear card 302 is assured by mechanical manufacturing.

In this step, in a direction parallel to the front card 301/rear card 302, a metal cutting tool 70 with an angular velocity w and a feed rate V is used to cut the portion of the cable 54 which protrudes out of the surface of the front card 301/rear card 302.

c. The surface is processed as desired. For instance, the surface may be processed by way of Immersion Silver, Immersion Tin, or gold electroplate, etc.

The foregoing is a detailed description to the backplane interconnection system and the method for mounting the backplane interconnection system according to the present embodiment. A traditional connection method such as surface mounted manner may be utilized where no special note is made.

The foregoing embodiments all focus on an orthogonal backplane interconnection system as an example. If the backplane interconnection system adopts the traditional mounting structure as illustrated in FIG. 1, the technical solutions of the present embodiment can also be adopted. That is, an impedance controlled mechanism can be mounted on the backplane and a backplane connector is then mounted on the backplane and the corresponding pin is coupled to the impedance controlled mechanism. Consequently, the crosstalk due to the via hole on the backplane can be eliminated.

Moreover, the transceiver on the slave circuit board can be coupled to the backplane connector via the high-speed cable. As such, signal attenuation among each interconnection path can be eliminated and the loss on each interconnection path can be reduced.

In all the foregoing embodiments, the cable connector 55 is mounted so as to ensure the reliability of connection between the cable 54 and other part. Thus, the cable can be prevented from being cut off by external force and from breaking the original connection easily. In the foregoing embodiments, the cable connector 55 can be omitted. The cable 54 can be welded directly to the other part.

As can be seen from each backplane interconnection system of the various embodiments and the process for manufacturing backplane, backplane connector in the system, the backplane is configured with a structure which has a shielding function and an impedance controlled function to realize the function of a via hole, i.e., replacing the via hole on the existing circuit board. Meanwhile, the problem of the inconsistency of the impedance and the crosstalk among each interconnection path is solved. Thus, the transmission performance of the circuit board is improved.

In the embodiment of the present invention, high-speed signal cable is used to transmit high-speed signal between each circuit board and the connector. Compared with the traditional method of transmitting the signal along a differential signal line on the circuit board, the present embodiment further succeeds in minimizing the loss on each interconnection path and the problem, that the delay varies in each path in the pair of the differential path due to anisotropy of the material used by traditional manufacturing for the printed slave circuit board, is overcome. Thus, the issue of reduced performance for the interconnection path in the circuit board interconnection system is alleviated or overcome.

Moreover, the embodiments of the present invention provide different impedance controlled mechanisms depending on the actual applications. The embodiments utilize various connection mechanisms to realize the connection between the high-speed cable and the transceiver and the circuit board connector as well as the connection between the circuit board connector and the impedance controlled mechanism. In addition, the impedance controlled mechanism can also be applied to the slave circuit board for substituting the existing via hole. Thus, these embodiments allow the present invention to be applied to different practical application environment and is capable of further improving the transmission performance of the interconnection paths in the circuit board interconnection system.

The technical solutions according to the foregoing embodiments may also be applicable to other circuit board interconnection system in addition to the backplane interconnection system.

For instance, the impedance controlled mechanism as illustrated in FIG. 7a, or 7b, or 8a, or 8b can be mounted on the multi-layer circuit board. The connector on which another functional circuit board is mounted on is mounted on the multi-layer circuit board and is coupled to the impedance controlled mechanism on the multi-layer circuit board. The functional circuit board mounted on the connector is coupled to a signal line on each layer of the multi-layer circuit board via the impedance controlled mechanism to allow the transmission of the signals.

Because the impedance value of the impedance controlled mechanism in each interconnection path is set depending on the actual circuit environment, the impedance is stable and is not subject to interference. Thus, the impedance continuity for each interconnection path formed by each layer of signal line connecting between the function circuit board and the multi-layer circuit board via the impedance controlled mechanism is enhanced. Moreover, if the functional circuit board is coupled to each layer of the multi-layer circuit board via multiple impedance controlled mechanism, respectively, each interconnection path including the impedance controlled mechanism may not suffer from the crosstalk since the impedance controlled mechanism has a shielding layer.

The foregoing is merely preferred embodiments of the present invention and is not intended to be limiting to the scope of the present invention. Any modifications, equivalents, improvements made within the spirit and principle of the present invention shall be construed as fall within the scope of the present invention.

What is claimed is:

1. A circuit board interconnection system, characterized in comprising, a first circuit board, a second circuit board, a third circuit board, a first connector and a second connector;
    wherein the first connector and the second connector are mounted at two sides of the first circuit board, respectively;
    the second circuit board is mounted on the first connector;
    the third circuit board is mounted on the second connector;
    the first connector and the second connector mounted respectively at the two sides of the first circuit board are coupled to each other via an impedance controlled mechanism;
    the first circuit board has a through hole at a position where the first connector and/or the second connector is mounted thereon;
    the impedance controlled mechanism comprises a hollow penetrating pin which can be inserted into the through hole and a penetrating pin which can be inserted into the hollow penetrating pin;
    the hollow penetrating pin is in a hollow structure made from metal material and the inner wall of the hollow penetrating pin is provided with a dielectric layer;
    the penetrating pin is a metallic conductor;
    the hollow penetrating pin is located on the first connector at one side of the first circuit board;
    the penetrating pin is located on the second connector at the other side of the first circuit board;
    the system further comprises at least two transceivers and a cable connecting the two transceivers;
    the two transceivers are mounted on the second circuit board and the third circuit board, respectively;
    the system further comprises a cable connector;
    the transceiver and the first connector are located at one side of the second circuit board and the cable connector is located at the other side of the second circuit board;
    two ends of the cable are coupled to two cable connectors respectively;
    on the second circuit board, there is further provided with at least two via holes coupled to the transceivers or an impedance controlled mechanism coupled to the transceivers;
    each cable connector is press-fitted into the via hole coupled to the second circuit board and the transceivers via a press-fit pin; or each cable connector is surface-mounted on the impedance controlled mechanism coupled to the second circuit board and the transceivers;
    the first connector is press-fitted by a press-fit pin into a same via hole in which the cable connector on the second circuit board is press-fitted; or the first connector is surface-mounted on a same impedance controlled mechanism on which the transceiver on the second circuit board is surface-mounted.

2. The system of claim 1, characterized in that, the inner surface of the dielectric layer of the hollow penetrating pin is provided with a metallic conductor layer.

3. The system of claim 1, characterized in that, the system further comprises cable connectors;
    wherein the transceivers, the first connector and the cable connectors are located at one side of the second circuit board;
    two ends of the cable are coupled to two cable connectors respectively;
    the transceivers are in a surface-mount packaging structure;
    the cable connector coupled to one end of the cable is coupled to a pad of a pin of the transceiver via a microstrip or the cable connector coupled to one end of the cable is surface-mounted on the top of the transceiver and directly coupled to the pin of the transceiver;
    the cable connector coupled to the other end of the cable is surface-mounted on the first connector.

4. The system of claim 1, characterized in that, the cable is buried in the second circuit board;
    the transceiver and the first connector are surface-mounted at one side of the second circuit board;

one end of the cable coupled to the transceiver by directly coupling to the bottom of the pad of the pin of the transceiver;

the other end of the cable is coupled to a side of the second circuit board where the first connector is surface-mounted thereon.

5. A communication device, comprising a circuit board interconnection system, the circuit board interconnection system is characterized in comprising a first circuit board, a second circuit board, a third circuit board, a first connector and a second connector;

wherein the first connector and the second connector are mounted at two sides of the first circuit board, respectively;

the second circuit board is mounted on the first connector;

the third circuit board is mounted on the second connector;

the first connector and the second connector mounted respectively at two sides of the first circuit board are coupled to each other via an impedance controlled mechanism on the first circuit board, the first circuit board has a through hole at a position where the first connector and/or the second connector is mounted thereon;

the impedance controlled mechanism comprises a hollow penetrating pin which can be inserted into the through hole and a penetrating pin which can be inserted into the hollow penetrating pin;

the hollow penetrating pin is in a hollow structure made from metal material and the inner wall of the hollow penetrating pin is provided with a dielectric layer;

the penetrating pin is a metallic conductor;

the hollow penetrating pin is located on the first connector at one side of the first circuit board;

the penetrating pin is located on the second connector at the other side of the first circuit board;

the system further comprises at least two transceivers and a cable connecting the two transceivers;

the two transceivers are mounted on the second circuit board and the third circuit board, respectively;

the system further comprises a cable connector;

the transceiver and the first connector are located at one side of the second circuit board and the cable connector is located at the other side of the second circuit board;

two ends of the cable are coupled to two cable connectors respectively;

on the second circuit board, there is further provided with at least two via holes coupled to the transceivers or an impedance controlled mechanism coupled to the transceivers;

each cable connector is press-fitted into the via hole coupled to the second circuit board and the transceivers via a press-fit pin; or each cable connector is surface-mounted on the impedance controlled mechanism coupled to the second circuit board and the transceivers;

the first connector is press-fitted by a press-fit pin into a same via hole in which the cable connector on the second circuit board is press-fitted; or the first connector is surface-mounted on a same impedance controlled mechanism on which the transceiver on the second circuit board is surface-mounted.

6. The system of claim 5, characterized in that, the inner surface of the dielectric layer of the hollow penetrating pin is provided with a metallic conductor layer.

7. The system of claim 5, characterized in that, the system further comprises cable connectors;

wherein the transceivers, the first connector and the cable connectors are located at one side of the second circuit board;

two ends of the cable are coupled to two cable connectors respectively;

the transceivers are in a surface-mount packaging structure;

the cable connector coupled to one end of the cable is coupled to a pad of a pin of the transceiver via a microstrip or the cable connector coupled to one end of the cable is surface-mounted on the top of the transceiver and directly coupled to the pin of the transceiver;

the cable connector coupled to the other end of the cable is surface-mounted on the first connector.

8. The system of claim 5, characterized in that, the cable is buried in the second circuit board;

the transceiver and the first connector are surface-mounted at one side of the second circuit board;

one end of the cable coupled to the transceiver by directly coupling to the bottom of the pad of the pin of the transceiver;

the other end of the cable is coupled to a side of the second circuit board where the first connector is surface-mounted thereon.

* * * * *